United States Patent
Sutton

(10) Patent No.: US 7,881,411 B2
(45) Date of Patent: Feb. 1, 2011

(54) MODULATION DEPENDENT AUTOMATIC GAIN CONTROL

(75) Inventor: Todd Sutton, Del Mar, CA (US)

(73) Assignee: Wi-Lan, Inc., Ottawa (CA)

( * ) Notice: Subject to any disclaimer, the term of this patent is extended or adjusted under 35 U.S.C. 154(b) by 977 days.

(21) Appl. No.: 11/381,959

(22) Filed: May 5, 2006

(65) Prior Publication Data

US 2007/0258548 A1 Nov. 8, 2007

(51) Int. Cl.
H04L 27/08 (2006.01)
(52) U.S. Cl. ........................ 375/345; 375/316
(58) Field of Classification Search ............... 375/316, 375/326–327, 340, 324, 344–345
See application file for complete search history.

(56) References Cited

U.S. PATENT DOCUMENTS

| | | | |
|---|---|---|---|
| 6,052,566 A | 4/2000 | Abramsky | |
| 6,311,047 B1 | 10/2001 | Gotou | |
| 6,571,083 B1 * | 5/2003 | Powell et al. | 455/69 |
| 6,658,069 B1 * | 12/2003 | Imura | 375/345 |
| 7,386,063 B1 * | 6/2008 | Husted | 375/316 |
| 2001/0053680 A1 * | 12/2001 | Yamanaka et al. | 455/232.1 |
| 2002/0024385 A1 * | 2/2002 | Korn | 330/282 |
| 2002/0142745 A1 * | 10/2002 | Kang et al. | 455/232.1 |
| 2002/0186796 A1 * | 12/2002 | McFarland et al. | 375/341 |
| 2003/0207674 A1 * | 11/2003 | Hughes | 455/234.1 |
| 2003/0227986 A1 | 12/2003 | Filipovic | |
| 2004/0097212 A1 * | 5/2004 | Matsumoto et al. | 455/296 |
| 2005/0047533 A1 * | 3/2005 | Ruelke et al. | 375/345 |
| 2005/0100119 A1 | 5/2005 | Husted et al. | |
| 2006/0052070 A1 * | 3/2006 | Jin et al. | 455/127.2 |

FOREIGN PATENT DOCUMENTS

| | | |
|---|---|---|
| WO | WO01/65758 A2 | 9/2001 |
| WO | WO02/056490 A2 | 7/2002 |
| WO | WO2004/025869 A2 | 3/2004 |
| WO | WO2005/078916 A1 | 8/2005 |

OTHER PUBLICATIONS

Eklund, Carl, et al. "IEEE Standard 802.16: A Technical Overview of the WirelessMan™ Air Interface for Broadband Wireless Access", *IEEE Communications Magazine* (Jun. 2002) pp. 98-107.

* cited by examiner

*Primary Examiner*—Emmanuel Bayard
(74) *Attorney, Agent, or Firm*—Volpe and Koenig, P.C.

(57) ABSTRACT

Automatic gain control (AGC) methods and apparatus that implement a dynamically variable AGC setpoint. The variable AGC setpoint can be determined based in part on the type of modulation used to convey information to the receiver. The AGC setpoint can be set higher than a nominal setpoint for higher order modulation types and can be lower than the nominal setpoint for low order modulation types. The manner in which gain is adjusted can also depend on the modulation type. The gains can be increased according to a front to back priority. The gains can be decreased in a priority that is based on the modulation type. For lower order modulation types, the gain controller can decrease gain according to a back to front priority. For higher order modulation types, the gain controller can maintain linearity of front end amplifiers prior to decreasing gain according to a back to front priority.

24 Claims, 5 Drawing Sheets

MODULATION DEPENDENT AUTOMATIC GAIN CONTROL

BACKGROUND OF THE INVENTION

Portable wireless communication devices typically experience a wide range of operating environments. The differing environments include differing physical environments as well as differing electronic environments, which may be related to the physical environments, but may be independent of the physical environment.

Physical environments include location, topography, weather conditions, as well as a host of other environmental conditions. Electronic environments include spectrum loading, the presence or absence of intentional or unintentional jamming signals, channel conditions, as well as other electronic environmental factors. The physical and electronic environments can combine in ways that widely affect the signal quality received by a portable wireless communication device.

The signal power received at a receiver can vary over a tremendous range. A receiver that is located in close proximity to a transmitter may receive a substantial signal, while a receiver that is located a large distance from the transmitter may receive a very weak signal. Path loss attributable to distance from a transmitter can itself be sufficient to degrade the signal quality at a receiver. Other physical and electronic environments can combine with distance to further extend the range of signal power over which the receiver is expected to operate. It is not uncommon for a portable receiver to experience an 80 dB dynamic range of incident power.

A receiver can include an Automatic Gain Control (AGC) loop, circuit, or module in order to at least partially compensate for the range of signal power incident on the receiver. The AGC module attempts to maintain a substantially constant signal power at a predetermined signal processing location within the receiver. The AGC module typically amplifies the received signal using a variable gain amplifier.

The AGC module compares a characteristic of the amplified signal, such as the amplified signal power, the amplified signal amplitude, or the amplified signal magnitude, at the predetermined signal processing location against a predetermined threshold value, referred to as the AGC setpoint, AGC threshold, or simply the setpoint. If the amplified signal characteristic is less than the AGC setpoint value, the AGC module increases the gain of the variable gain module. The AGC module is able to increase the gain of the variable gain amplifier up to a predetermined maximum gain. If the amplified signal characteristic is greater than the AGC setpoint, the AGC module decreases the gain of the variable gain module. The AGC module is able to decrease the gain of the variable gain amplifier down to a predetermined minimum.

The difference between the predetermined maximum and the predetermined minimum represents the AGC range. The AGC module can operate to maintain a substantially constant signal power at the predetermined signal processing location over the entire AGC range.

However, if the received signal includes substantial interfering signal sources, the AGC module may control the gain based on the composite signal having the desired received signal and received interfering signals.

BRIEF SUMMARY OF THE INVENTION

AGC methods and apparatus that implement a dynamically variable AGC setpoint based on mode dependent gain control are described herein. A receiver can determine the variable AGC setpoint based in part on a mode type, such as the type of modulation, used to convey information to the receiver. The AGC setpoint can be set higher than a nominal setpoint for higher order modulation types and can be lower than the nominal setpoint for low order modulation types. The manner in which gain is adjusted can also depend on the modulation type. The gains can be increased according to a front to back priority. In this context, front refers to proximity to a front-end of an amplifier chain, and back refers to proximity to an output of the amplifier chain. The amplifier chain need not be a directly connected chain of amplifiers, but may be amplifiers distributed across a signal processing path. Therefore, increasing gains in a front to back priority causes gains in amplifiers near the front-end of an amplifier chain to be increased before gains in subsequent stages of amplification. The gains can be decreased in a priority that is based on the modulation type. For lower order modulation types, the gain controller can decrease gain according to a back to front priority. For higher order modulation types, the gain controller can maintain linearity of front end amplifiers prior to decreasing gain according to a back to front priority.

Aspects of the invention include a method of controlling gain in a receiver. The method includes determining a mode type, determining an Automatic Gain Control (AGC) setpoint value based at least in part on the mode type, and adjusting gain based in part on the AGC setpoint.

Aspects of the invention include a method of controlling gain in a receiver. The method includes receiving over a wireless channel a mode assignment message indicative of a mode type for an identified frame of data, selecting an Automatic Gain Control (AGC) setpoint value from a plurality of setpoint values based on the mode type, where each setpoint value in the plurality of setpoint values corresponds to at least one mode type, comparing a characteristic of a signal received during the identified frame of data to the AGC setpoint value, and adjusting a gain of at least one of a plurality of variable gain amplifiers based on the comparison.

Aspects of the invention include an apparatus with variable gain control that includes a variable gain amplifier module having a signal input, a signal output, and a control input, and configured to provide a gain in response to a control input signal, a processor configured to determine a mode type of a signal amplified by the variable gain amplifier module, a setpoint processor coupled to the processor and the output of the variable gain amplifier module, and configured to determine an Automatic Gain Control (AGC) setpoint value based on the mode type, and configured to determine a gain control based on a comparison of a characteristic of a signal at the output of the variable gain amplifier to the AGC setpoint value, and a gain controller configured to determine the control input signal based on the gain control.

Aspects of the invention include an apparatus with variable gain control that includes a variable gain amplifier module having an input, an output, and a gain control input, and configured to amplify a received signal, an Analog to Digital Converter (ADC) having an input coupled to the output of the variable gain amplifier module and configured to generate a digital representation of the received signal, an AGC setpoint module configured to determine an AGC setpoint value based at least in part on a mode type of the received signal, and output the AGC setpoint value, and a comparator having a first input coupled to the ADC and a second input coupled to the AGC setpoint module, and configured to compare a characteristic of the digital representation of the received signal to the AGC setpoint value and generate a control signal coupled to the gain control input of the variable gain amplifier module.

Aspects of the invention include an apparatus with variable gain control that includes means for determining a mode type, means for determining an Automatic Gain Control (AGC) setpoint value based at least in part on the mode type, and means for adjusting gain based in part on the AGC setpoint.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

DETAILED DESCRIPTION OF THE INVENTION

A receiver can implement mode dependent variable gain control by amplifying a received signal based on a control signal, and adjusting the control signal that varies the amplification based on a mode type of the received signal. The receiver is able to optimize an AGC setpoint based on the mode type.

Figure 1:
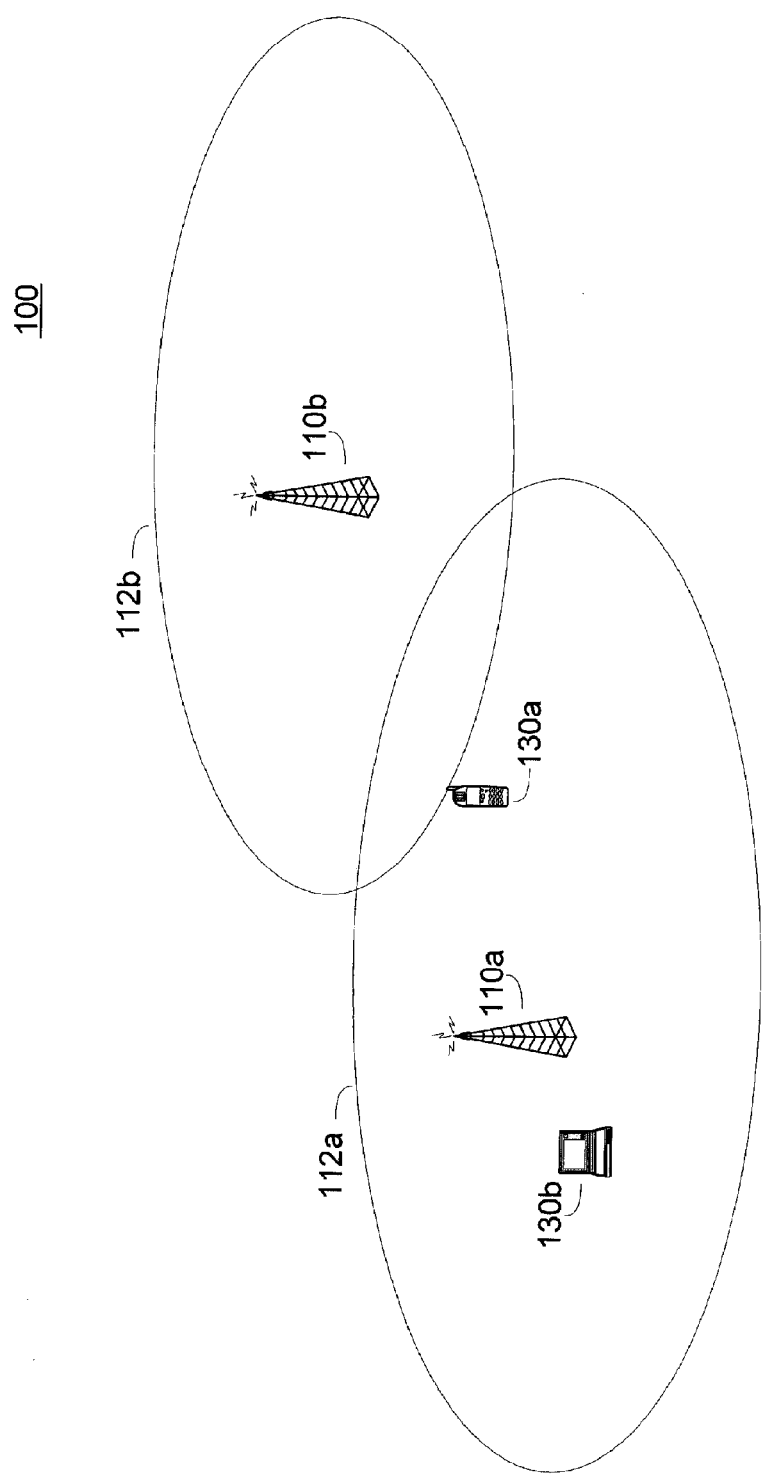
FIG. 1 is a simplified functional block diagram of an embodiment of a wireless communication system.

FIG. 1 is a simplified functional block diagram of an embodiment of a wireless communication system 100. The wireless communication system 100 includes a plurality of base stations 110a, 110b, each supporting a corresponding service or coverage area 112a, 112b. Each base station 110a and 110b can be coupled to a network (not shown) such as a wired network, and can be configured to allow wireless communication with devices on the wired network.

A base station, for example 110a, can communicate with wireless devices within its coverage area 112a. For example, the first base station 110a can wirelessly communicate with a first subscriber station 130a and a second subscriber station 130b within the coverage area 112a. In another example, the first subscriber station 130a can communicate with a remote device (not shown) via the first base station 110a. In another example, the first subscriber station 130a can communicate with the second subscriber station 130b via the first base station 110a.

The base stations, 110a and 110b, can be part of the same communication network or can be part of distinct communications networks. The base stations 110a and 110b can be in communication with each other, either through a direct communication link or via an intermediary network. Alternatively, where the base stations 110a and 110b are in distinct networks, a first base station 110a may have no knowledge regarding the operation of the second base station 110b.

There may be any number of base stations 110a and 110b within a wireless communication system 100, although FIG. 1 depicts only two base stations 110a and 110b. The base stations 110a and 110b alternatively can be referred to as access points or nodes.

Although only two subscriber stations 130a and 130b are shown in the wireless communication system 100, the system can be configured to support virtually any number of subscriber stations. The subscriber stations 130a and 130b can be mobile stations or stationary stations. The subscriber stations 130a and 130b alternatively can be referred to, for example, as mobile stations, mobile units, or wireless terminals.

A mobile station can be, for example, a wireless handheld device, a vehicle mounted portable device, or a relocatable portable device. A mobile subscriber station can take the form of, for example, a handheld processor, a notebook computer, a wireless telephone, or some other type of mobile device.

The base station 110a or 110b can be configured to adjust a data rate of the communication link with the subscriber stations 130a and 130b based on a signal quality experienced by the subscriber stations 130a and 130b. For example, the base station 110a can allocate a lower data rate to a first subscriber station 130a experiencing a low signal quality, and can allocate a higher data rate to a second subscriber station 130b experiencing a high signal quality. Here, the terms "high" and "low" are relative, and can be relative to an expected, average, reference, or nominal level of signal quality or data rate.

The signal quality experienced by the different subscriber stations 130a and 130b can vary depending on a variety of factors, including proximity to the servicing base station 110a, and proximity to interference sources, such as adjacent base station 110b. The base stations 110a and 110b can dynamically and independently vary the transmitted data rate depending on the signal quality at the subscriber stations 130a and 130b.

For example, the first subscriber station 130a may be in distant proximity to the first base station 110a. Therefore, the signal transmitted to the first subscriber station 130a by the first base station 110a can experience a substantial path loss. Additionally, the first subscriber station 130a can be within a range of a second base station 110b or some other signal source (not shown) that effectively operates as an interfering signal source. The interfering signal source operates to further degrade the signal quality received by the first subscriber station 130a. In effect, the interfering signal source operates as a signal jammer, inhibiting the performance of the first subscriber station 130a.

The first base station 110a can compensate for a lower signal quality at the first subscriber station 130a by transmitting signals at a lower data rate, for example, using a more robust modulation type or a more robust encoding technique.

In contrast, the second subscriber station 130b can be in a relative noise free environment or in close proximity to the servicing base station 110a. In such an environment, the second subscriber station 130b typically receives a transmission from the first base station 110a with a high signal quality.

The first base station 110a can capitalize on the high signal quality of the signals received by the second subscriber station 130b by transmitting signals to the second subscriber station 130b at a high data rate. The second subscriber station 130b can continue to receive high data rate transmissions for as long as the received signal quality supports it.

The base stations 110a and 110b can thus adjust the data rate transmitted to the subscriber stations 130a and 130b based in part on the quality of the received signal. The base stations 110a and 110b can allocate higher data rates to those subscriber stations, for example 110b, that can support the higher data rates, and can allocate lower data rates to those subscriber stations, for example 130a, that support lower data rates.

The subscriber stations 130a and 130b can operate to improve the communications between the base stations 110a and 110b by performing automatic gain control (AGC) on the received signals. The subscriber stations 130a and 130b can provide higher gain to weak received signals and can provide lower gains to strong received signals. The manner in which the subscriber stations 130a and 130b control the gain and the optimal signal level can depend on the data rate transmitted by the base stations 110a and 110b. For example, the AGC modules within the subscriber stations 130a and 130b can operate differently based on the data rate, modulation type, encoding type, or some other parameter or combination of parameters associated with data throughput.

In one example, the wireless communication system 100 is configured for Orthogonal Frequency Division Multiple Access (OFDMA) communications. The wireless communication system 100 is not limited to an OFDMA system, and the variable AGC described herein is not limited to application in OFDMA systems. The description is offered for the purposes of providing a particular example of the operation of variable AGC in a wireless communication environment.

The base stations 110a and 110b are configured to transmit data packets organized in frames using one or more slots. Each slot can be a predetermined number of Orthogonal Frequency Division Multiplex (OFDM) subcarriers.

The base stations 110a and 110b can also be configured to dynamically vary the modulation type and encoding rate of the information transmitted to the subscriber stations 130a and 130b. The base stations 110a and 110b can vary the modulation type and encoding rate on frame barriers, and can vary the modulation type and encoding rate for each subscriber station individually.

For example, each of the base stations 110a and 110b can determine a modulation type and encoding rate from a plurality of modulation types and encoding rates. The base stations 110a and 110b can be configured to select from a predetermined number of modulation types that can include Quadrature Phase Shift Keying (QPSK) and various dimensions of Quadrature Amplitude Modulation (QAM), such as 16-QAM and 64-QAM.

Each modulation type can have a limited number of available encoding rates. For example, QPSK modulation can be associated with rate 1/2 or rate 3/4 encoding, 16-QAM can be associated with rate 1/2 or rate 3/4 encoding, and 64-QAM can be associated with rate 1/2, rate 2/3, or rate 3/4 encoding. Thus, a base station 110a, 110b can select a modulation type-encoding rate pair from a possible seven different types.

The base stations 110a and 110b can communicate the modulation type-encoder rate pair to a subscriber station 130a or 130b in an overhead message. In one embodiment, the overhead message can be a broadcast message that includes resource allocation information. For example, the overhead message can include the timing, modulation type-encoder rate pair, and slot information allocated to each of the subscriber stations 130a and 130b in the current frame or one or more subsequent frames. The base stations 110a and 110b can associate particular information with an identifier to allow the receiving subscriber stations 130a and 130b to determine which resources are allocated to them.

The base stations 110a and 110b can transmit the overhead message using a predetermined modulation type and encoder rate, such that the subscriber stations 130a and 130b know, a priori, how to process the overhead message. For example, the base stations 110a and 110b can transmit the overhead messages using the lowest data rate, that is, QPSK at rate 1/2.

In the example described above, the first subscriber station 130a can be in an environment where the signal transmitted by the first base station 110a is subject to a large path loss. Additionally, one or more signal sources, such as the second base station 110b, can operate as unintentional interfering sources, and can degrade the signal incident on the first subscriber station 130a. The first base station 110a can allocate a more robust modulation type-encoder rate pair to the communication link to the first subscriber station 130a. Here, the term "more robust" is relative to the six other modulation type-encoder rate pairs that the first base station 110a can select for the communication link.

The first base station 110a can communicate the modulation type and encoder rate to the first subscriber station 130a in an overhead message. The first subscriber station 130a determines the modulation type and encoder rate based on the received overhead message. The first subscriber station 130a can also control the AGC based in part on the modulation type and encoder rate information.

The first subscriber station 130a can adjust an AGC setpoint to a predetermined value based on the modulation type. The QPSK signal is more insensitive to amplitude variations compared to a 16-QAM or 64-QAM signal. The first subscriber station 130a can set the AGC setpoint to a value that is lower than a setpoint value used for 16-QAM or 64-QAM modulation. Setting the setpoint value to a lower value allows the first subscriber station 130a to maintain a higher headroom. A higher headroom allows for interfering sources without saturating any devices within the signal processing path. The first subscriber station 130a can adjust the gain of one or more variable gain amplifiers based on the modulation dependent AGC setpoint.

The first subscriber station 130a can also control the process by which the gain of the variable gain amplifiers is adjusted. For example, based on the allocation of QPSK modulation, the first subscriber station 130a can be configured to initially reduce the gain of a first variable gain amplifier in a series of variable gain amplifiers. The first subscriber station can then adjust the gain of the variable gain amplifiers in a back to front hierarchy, where back refers to the amplifier near the end of a series chain of amplifiers.

The second subscriber station 130b is in a more favorable environment and can typically support a higher data rate. The first base station 110a can, for example, allocate a higher modulation type-encoder rate pair to the communication link with the second subscriber station 130b. For example, the first base station 110a can allocate a 64-QAM rate 1/2 data configuration to the second subscriber station 130b. The first base station 110a can communicate the allocation to the second subscriber station 130b in an overhead message.

The second subscriber station 130b determines the modulation type and encoder rate based on the received overhead message. The second subscriber station 130b can control the AGC based in part on the modulation type and encoder rate information.

For example, the second subscriber station 130b can adjust its AGC setpoint to a predetermined value based on the modulation type. The second subscriber station 130b can, for example, select the highest AGC setpoint from a list of predetermined AGC setpoints. The second subscriber station 130b can then adjust the gain based on the AGC setpoint.

The second subscriber station 130b can control the process by which the AGC module controls the gains of variable gain amplifiers based in part on the modulation type. The second subscriber station 130b can be configured to adjust the gain of the variable gain amplifiers in a back to front hierarchy, based on the allocation of 64-QAM modulation type.

Figure 2:
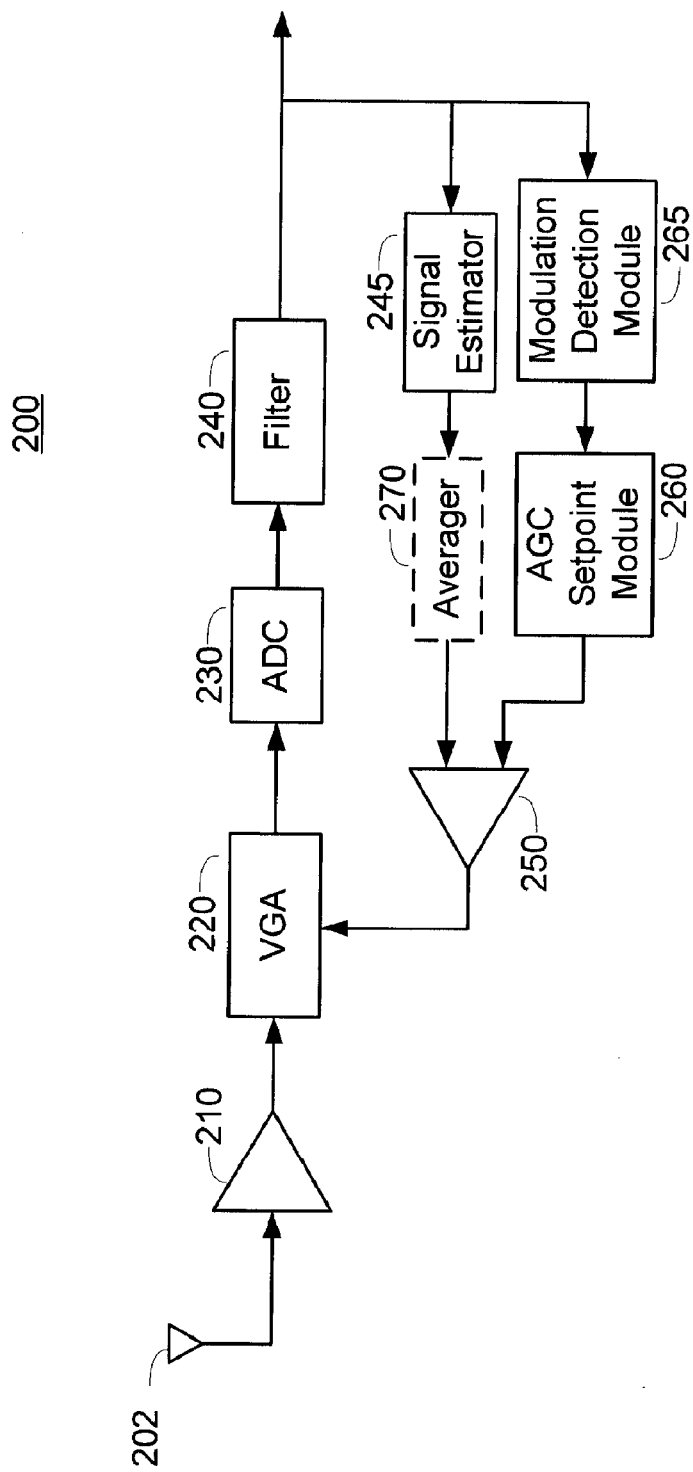
FIG. 2 is a simplified functional block diagram of an embodiment of a receiver having automatic gain control.

FIG. 2 is a simplified functional block diagram of an embodiment of a portion of a receiver 200. The receiver 200 can be, for example, a receiver portion integrated in one of the subscriber stations of the wireless communication system of FIG. 1. Only portions of the receiver 200 are illustrated for the purposes of brevity and clarity.

The receiver 200 includes an antenna 202 coupled to a front end module 210. The output of the front end module is coupled to a variable gain amplifier module 220. The amplified output from the variable gain amplifier module 220 is coupled to the input of an analog to digital converter (ADC) 230. The output of the ADC 230 is coupled to a filter 240. The output of the filter 240 is coupled to further processing stages (not shown) that can include, for example, baseband signal processing stages.

The filter 240 can be conveniently a digital filter, such as a Finite Impulse Response (FIR), Infinite Impulse Response (IIR), Kaiser, Kalman, and the like, or some other means for filtering. The digital filter may be advantageous because a digital implementation may allow for a large filter order, providing a sharp transition band and large rejection of signals in adjacent channels. The digital filter implementation can be preferred over an analog implementation, because a high order analog filter requires numerous components, which contribute to increased costs and increased volume.

The output of the filter 240 is also coupled to an input of a signal estimator 245 that can determine an estimate of a receive signal parameter. For example, the signal estimator 245 can be a power estimator, power detector, energy estimator, and the like, or some other estimator of a receive signal parameter. In receiver embodiments having separate in-phase (I) and quadrature (Q) signal paths, the signal estimator 245 can be configured to generate an estimate of the signal energy by summing the squares of the I and Q signal amplitudes ($I^2+Q^2$).

The output of the signal estimator 245 is coupled to a first input of a comparator 250 used to generate a signal for use in an AGC feedback loop. In another embodiment, the output of the signal estimator 245 is coupled to an averager 270 and the output of the averager 270 is coupled to the first input of the comparator 250. In another embodiment, the averager 270 can be replaced with a filter or a filter that also performs averaging.

The output of the filter 240 can also be coupled to an input of a modulation detection module 265. The modulation detection module 265 can be configured to determine the type of modulation that the receiver 200 expects to receive. For example, the modulation detection module 265 can examine an overhead or resource allocation message in the received signal to determine the type of modulation used to send information to the receiver 200 during some subsequent defined period, which may be a frame, slot, or some other predetermined period of time. The modulation detection module 265 can determine or otherwise control a signal, message, or control element that is indicative of the type of modulation that the receiver 200 is expected to receive.

An AGC setpoint module 260 is configured to generate or otherwise determine an AGC setpoint value. The AGC setpoint module 260 generates or otherwise determines the setpoint value based at least in part on a type of modulation that the receiver 200 expects is used to modulate the received signal. For example, the AGC setpoint module 260 can receive a control signal or message from the modulation detection module 265 indicative of the modulation type. In another embodiment, the AGC setpoint module 260 can access a register, bit, or flag that is indicative of the modulation type, and which may be controlled by the modulation detection module 265. The AGC setpoint module 260 couples the setpoint value to a second input of the comparator 250.

The comparator 250 compares the amplified, filtered, and estimated receive signal value to the value of the AGC setpoint. The output of the comparator 250 is coupled as a control input to the variable gain amplifier module 220.

Although the receiver 200 is illustrated as a wireless receiver 200 having an antenna 202, the receiver 200 and variable AGC are not limited to wireless applications. In other embodiments, the antenna 202 can be replaced with an interconnection, coupler, and the like, or some other means for receiving an input signal.

The front end module 210 can be configured to perform one or more functions, including filtering, amplifying and frequency converting the received signal. For example, the front end module 210 can be configured to amplify the received signal using a fixed gain amplifier, filter the signal, and frequency downconvert the signal to a baseband signal. The front end module 210 can include passive elements, such as filters and couplers, and may not have any active signal processing elements.

In another embodiment, the front end module 210 can be omitted and the received signal can be coupled from the antenna 202 to the variable gain amplifier module 220. In another embodiment, the front end module 210 can be incorporated within the variable gain amplifier module 220, and the functions of the front end module 210 can be performed by a unified front end variable gain amplifier module.

The variable gain amplifier module 220 can include one or more variable gain amplifiers and may also include filtering and frequency conversion stages. Where the variable gain amplifier module 220 includes a plurality of variable gain amplifiers, the amplifier gains can be controlled by one or more control signals. The gain of each variable gain amplifier can be set independently, or two or more amplifiers may share the same control signal.

In one embodiment, the variable gain amplifier module 220 includes a plurality of variable gain amplifiers coupled in series. In another embodiment, the variable gain amplifier module 220 can include two or more amplifiers in parallel configuration. In yet another embodiment the variable gain amplifier module 220 can include a combination of parallel and series amplifiers. In yet another embodiment, the variable gain amplifier module 220 can include a variable means for amplifying a signal.

The ADC 230 can be any type of ADC, such as a delta-sigma ADC, a flash ADC, and the like, or some other means for converting an analog signal to a digital representation. The ADC 230 can be configured to have a fixed conversion range. Thus, signals that are smaller than the Least Significant Bit may not be detected, while signals greater than the full scale capabilities of the ADC 230 saturate the ADC 230.

It may be advantageous to set an AGC setpoint such that the signal output from the variable gain amplifier module 220 occupies nearly the full scale range of the ADC 230. In such a situation, the receiver 200 is able to reduce the effects of ADC generated noise, such as quantization noise. If the AGC setpoint is set to a value that is significantly less than a full scale range of the ADC 230, the effects of quantization noise may be more apparent.

However, the receiver 200 embodiment of FIG. 2 performs AGC on the digitized and filtered received signal. The interfering signals contributing to the received signal may be more effectively removed or reduced by the filter 240. The signal operated on by the variable gain amplifier module 220 and ADC 230 can include significant undesirable signal components.

The receiver 200 can set the AGC setpoint to a value that accommodates some level of interfering signal, such that the additional signal amplitude attributable to the undesirable signal components do not result in saturation of the ADC 230. The difference between the full scale range of the ADC 230 and the AGC setpoint value can be referred to as "headroom." A signal having no or relatively insignificant undesirable signal components can operate with less headroom compared to a signal having a large or relatively significant undesirable signal component that will be removed by subsequent filtering.

The receiver 200 can also set different AGC setpoint values for different modulation types. Some modulation types, for example those having a large number of constellation points, can be relatively sensitive to noise. In contrast, modulation types having relatively few constellation points, such as BPSK or QPSK, are more insensitive to noise, such as thermal and quantization noise.

Thus, the effect of quantization noise or other noise can have a larger effect on modulation types such as 16-QAM or 64-QAM compared to QPSK modulation type. Thus, the receiver 200 can set the AGC setpoint to a lower value for smaller constellation modulation types, without significantly degrading the signal quality. A benefit of a lower AGC setpoint is the greater headroom to accommodate additional undesirable signal components without saturating the ADC 230.

In one embodiment, the AGC setpoint module 260 determines a modulation type, for example from a received overhead signal or from a control signal generated based on the received overhead signal. The AGC setpoint module 260 can select an AGC setpoint value based on the modulation type from a discrete number of stored values. In another embodiment, the AGC setpoint module 260 can determine an AGC setpoint value based on a characteristic curve or reference polynomial, or some other manner of determining a setpoint value spanning a range of setpoint values. In another embodiment, the AGC setpoint module 260 can determine the AGC setpoint value based on a combination of stored values and values determined based on one or more parameters. In another embodiment, the AGC setpoint module 260 can determine the AGC setpoint value based on a mode type index and incrementing or decrementing an AGC setpoint value by a number of predetermined increments based on the mode index.

The output of the AGC setpoint module 250 is coupled to the comparator 250. The comparator 250 can be configured such that the comparator output controls the variable gain amplifier module 220 to increase the gain if the received signal is less than the AGC setpoint. Additionally, the comparator output controls the variable gain amplifier module 220 to decrease the gain if the received signal is greater than the AGC setpoint.

Figure 3:
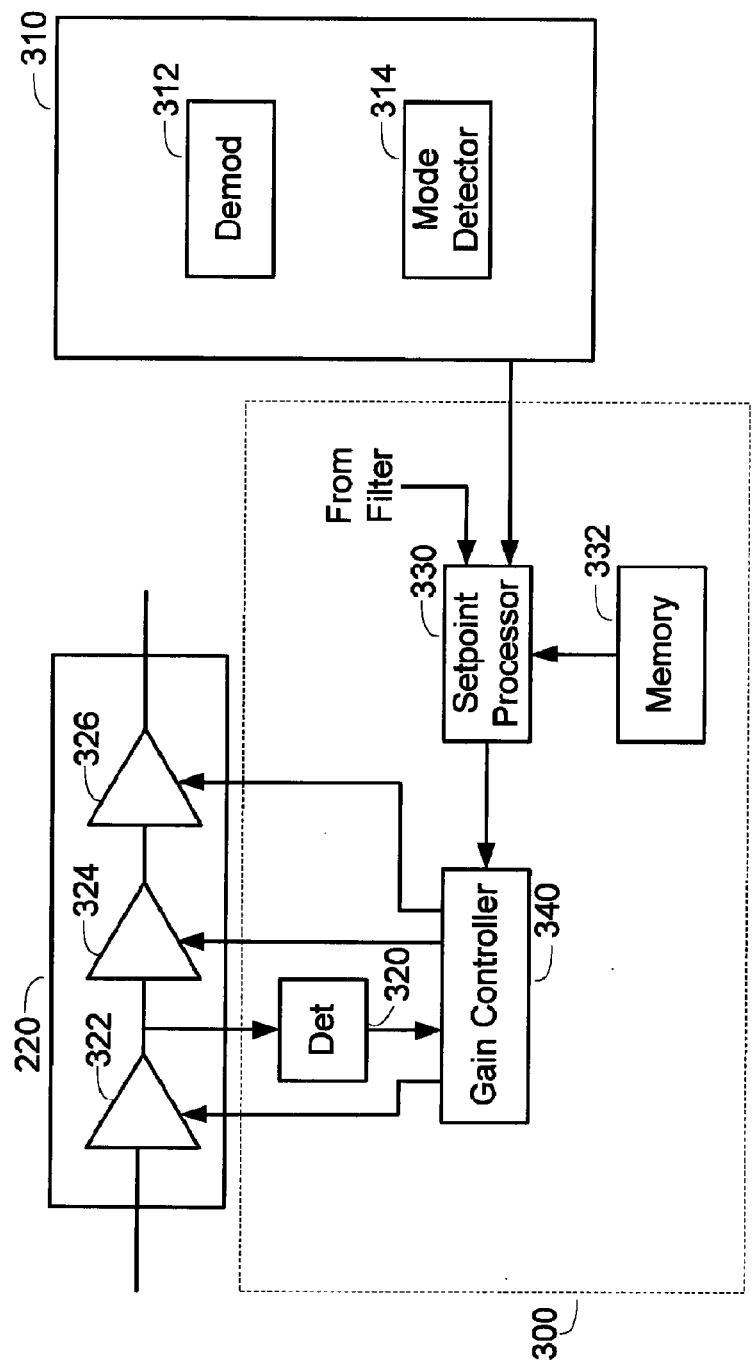
FIG. 3 is a simplified functional block diagram of an embodiment of modulation dependent automatic gain control.

The receiver 200 of FIG. 2 shows a single output from the AGC setpoint module 260 and a single control line to the variable gain amplifier module 220. However, variable AGC setpoint is not limited to such a configuration. FIG. 3 is a functional block diagram of an embodiment of variable AGC setpoint module 300 in a receiver, such as the receiver of FIG. 2.

The variable AGC setpoint module 300 is shown interfacing with portions of a receiver. Remaining portions of the receiver have been omitted for the sake of brevity and clarity.

The variable gain amplifier module 220 shown in FIG. 3 includes three variable gain amplifiers, 322, 324, and 326, coupled in series. Each of the variable gain amplifiers 322, 324, and 326 includes a distinct control input, such that the gain of each of the variable gain amplifiers 322, 324, and 326 can be individually controlled.

The variable AGC setpoint module 300 is coupled to a baseband processor 310 that includes a demodulator 312 and a mode detector 314. The baseband processor 310 can be configured, for example, to demodulate the received overhead signal according to the predetermined modulation type. The demodulator 312 can couple the demodulated overhead signal to the mode detector 314 to determine the operating mode. In one embodiment, the mode detector 314 determines a modulation type based on the demodulated signal. In another embodiment, the mode detector 314 determines a modulation type and an encoding rate or encoding type. In another embodiment, the mode detector 314 determines a data rate.

The baseband processor communicates the mode type to a setpoint processor 330. The setpoint processor 330 can be configured to determine a setpoint, for example, by selecting a setpoint from a list of setpoints based in part on the mode type. The setpoint processor 330 can receive the mode type from the baseband processor 310, and can retrieve a corresponding setpoint value from a plurality of setpoint values stored in memory 332.

In an example, the memory 332 can store seven distinct setpoint values, with each setpoint value corresponding to one of the modulation type-encoding rate pairs previously discussed in relation to FIG. 1. The setpoint processor 330 can determine which of the modulation type-encoding rate pair is active based on the mode type signal received from the baseband processor 310. The setpoint processor 330 can retrieve the corresponding setpoint value from memory 332 for use in the AGC loop.

The setpoint processor 330 can also perform the comparison performed by the comparator of FIG. 2. The setpoint processor 330 can receive the filtered signal from the filter (not shown), which is coupled to an output of the variable gain amplifier module 220 and may optionally average the signal value over a predetermined period or number of samples. The setpoint processor 330 compares the signal value, whether direct or averaged, against the retrieved setpoint value. The gain control output of the comparison can be as simple as a high or low value, or may be indicative of the magnitude and sign of the difference. The setpoint processor 330 communicates the gain control results of the comparison to a gain controller 340. The setpoint processor 330 can also communicate the mode type to the gain controller 340, or the gain controller 340 can receive the mode type from the baseband processor 310.

The gain controller 340 can vary the gain of the variable gain amplifier module 220 based on the gain control generated from the comparison of the signal value to the setpoint value and based in part on the mode type. For example, for a first mode type, the gain controller 340 can decrease the gain in a back to front order or hierarchy, and can increase gain according to a front to back hierarchy. In order to increase the gain in a front to back hierarchy, the gain controller 340 first increases the gain of the first variable gain amplifier 322 until a maximum gain is achieved. If still more gain is required, the gain controller 340 increases the gain of the second variable gain amplifier 324, up to a maximum value. The gain controller 340 repeats this for the third variable gain amplifier 324 if required.

Conversely, the gain controller 340 decreases gain in a back to front hierarchy, where the gain controller 340 decreases the gain of the final variable gain amplifier 326 initially, until the gain is sufficiently reduced or a minimum gain value is reached. The gain controller 340 then continues by decreasing the gain of the second variable gain amplifier 324 until the gain value is reached or until the minimum gain value is reached. The gain controller continues by controlling the gain of the first variable gain amplifier 322.

For a second mode type, the gain controller 340 can determine a gain of the first variable gain amplifier 322 and adjust it accordingly before backing off gain in a back to front hierarchy. The gain controller 340 can conversely increase the gain in a front to back hierarchy, as in the previous embodiment.

To decrease the gain, the gain controller can first determine if the first variable gain amplifier 322 is operating at a maximum gain. If so, the gain controller 340 can back off the gain by a predetermined amount, for example, 6 dB. Then, the gain controller 340 can decrease gain according to the back to front hierarchy and increase gain according to a front to back hierarchy. In the second mode type, the gain controller 340 reaches maximum gain by adjusting the initial variable gain amplifier up from the predetermined backoff after all other amplifiers are at maximum gain.

In a third mode type, the gain controller 340 can control gain by monitoring the output of the first variable gain amplifier 322, and adjusting the gain based on the signal at the output of the first variable gain amplifier 322. For example, the output of the first variable gain amplifier 322 can be coupled to a detector 320 that can be used to determine a signal amplitude or signal power output from the first variable gain amplifier 322.

The gain controller 340 can monitor the detector 320 output to ensure that the first variable gain amplifier 322 remains in its linear operating range. The signal processing path of the receiver can be initially calibrated through the first variable gain amplifier 322, using the detector 320. The gain controller 340 can store a table of the gain characteristic of the first variable gain amplifier 322. Alternatively, the gain controller 340 can store a value that is indicative of the nonlinearity of the first variable gain amplifier 322. For example, the gain controller 340 can store the detector 320 output corresponding to the 1 dB gain compression point of the first variable gain amplifier 322. The gain controller 320 can determine, based on the value output from the detector 320, whether the first variable gain amplifier 322 is operating within its linear region.

If the first variable gain amplifier 322 is operating in its linear region, the gain controller 340 decreases gain in accordance with a back to front hierarchy. If, however, the gain controller 340 determines that the first variable gain amplifier 322 is no longer operating in its linear region, the gain controller 340 initially decreases the gain of the first variable gain amplifier 322 until the amplifier is operating in its linear region. The gain controller 340 then proceeds to decrease gain according to a back to front hierarchy and increases gain according to a front to back hierarchy, while maintaining linearity of the first variable gain amplifier 322.

Thus, the gain controller 340 can operate to more intelligently control the gains of the variable gain amplifier module 220 and the variable gain amplifiers 322, 324, 326 within. For a mode type that typically does not include undesirable signal components, such as 16-QAM or 64-QAM, the gain controller 340 can control gains by decreasing the gains according to a back to front hierarchy. However, for mode types that may experience significant undesirable signal components, such as QPSK, the gain controller 340 can operate to maintain linearity of at least the first variable gain amplifier 322, before decreasing gains in accordance with a back to front hierarchy.

The gain controller 340 can maintain linearity of the first variable gain amplifier 322 by backing off its gain from a maximum gain by a predetermined amount, or by monitoring the output power of the amplifier and comparing the power to a predetermined calibration curve or point.

Figures 4, 5:
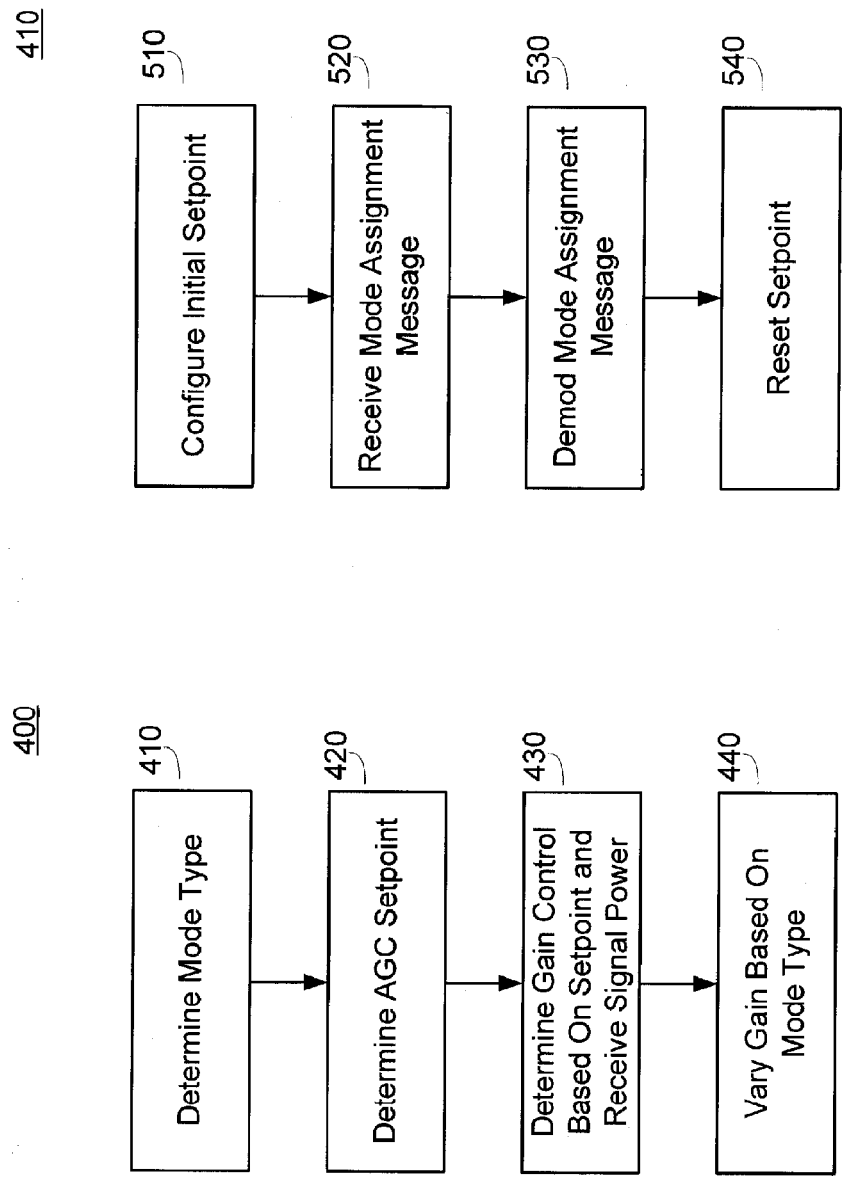
FIG. 4 is a simplified flowchart of an embodiment of a method of automatic gain control.
FIG. 5 is a simplified flowchart of an embodiment of a method of determining a modulation type.

FIG. 4 is a simplified flowchart of a method 400 of controlling gain in a receiver based on an operating mode. The subscriber stations of FIG. 1 or the receiver of FIG. 2 can perform the method 400. Additionally, the variable AGC setpoint module in combination with the baseband processor, as shown in FIG. 3, can perform the method 400.

The method 400 begins at block 410, where the receiver determines the mode type. The receiver can be configured to determine the mode type in any one of various ways. An embodiment is described in FIG. 5.

After determining the mode type, which can include a data rate, modulation type, encoder rate, or some combination thereof, the receiver proceeds to block 420 and determines an AGC setpoint. The receiver can, for example, retrieve a corresponding AGC setpoint from a list of AGC setpoints stored in memory. Each of the AGC setpoints stored in memory can correspond to one or more mode types. For example, a memory can store a distinct AGC setpoint for each of seven distinct modulation type-encoder rate pairs. Alternatively, the memory can store a distinct AGC setpoint for each modulation type, although there may be several modulation type-encoder rate possibilities.

The receiver uses the mode dependent AGC setpoint in block 430, where the receiver determines the gain change direction based on the mode dependent setpoint. The receiver can compare the received signal to the mode dependent setpoint and can determine if the gain should be increased or decreased. For example, the receiver can compare the power or energy of the amplified receive signal to the mode dependent setpoint to determine if the gain should be increased or decreased.

After determining the direction of the gain change, the receiver proceeds to block 440 and varies the gain based on the gain direction and the mode type. In another embodiment, the receiver can vary the gain using the same process for all mode types.

For example, the receiver can decrease gain according to a back to front hierarchy and increase gain in a front to back hierarchy for a first mode type. The receiver can maintain linearity of the first variable gain amplifier for a second mode type. After maintaining linearity of the first variable gain amplifier, the receiver can decrease gain according to a back to front hierarchy and increase gain in a front to back hierarchy for a first mode type.

The receiver can maintain linearity of the first variable gain amplifier by decreasing the gain of the first variable gain amplifier by a predetermined amount. For example, the receiver can set a lower maximum gain value for the first variable gain amplifier based on the mode type. Alternatively, the receiver can monitor the power output from the first variable gain amplifier and compare the power against a predetermined calibration curve, or a point indicative of nonlinearity. The receiver can maintain the first variable gain amplifier in a linear operating region.

The receiver may optionally return to block 410 to repeat the gain control method 400. Alternatively, the receiver can perform the gain control method 400 in response to an event trigger or periodic control, for example, by a processor.

FIG. 5 is a simplified flowchart of an embodiment of a method 420 of determining a mode type. The method 420 can be performed by a receiver in the method of gain control shown in FIG. 4.

The method 420 is based on receiving a mode type assignment in an overhead message, where the overhead message is transmitted using a predetermined mode type, which may be distinct from the mode type assigned to the receiver in the overhead message. There are at least two embodiments that can be implemented. The receiver can optimize the AGC setpoint for the overhead message based on the predetermined mode type. Alternatively, the receiver can use whatever AGC setpoint is currently active during receipt of the overhead message, even though the currently active AGC setpoint may not be the setpoint associated with the predetermined mode type of the overhead message.

The method 420 begins at block 510, where the receiver configures an initial AGC setpoint. The initial AGC setpoint can be the currently active AGC setpoint or can be an AGC setpoint that corresponds to the known mode type used to transmit the overhead message. The receiver proceeds to block 520 and receives the overhead message including the mode assignment message.

The receiver proceeds to block 530 and demodulates the overhead message, based on knowledge of the predetermined mode type associated with the overhead message. The receiver extracts the mode assignment message from the overhead message. The receiver proceeds to block 540 and resets the AGC setpoint to the previously active AGC setpoint. Alternatively, the receiver can omit the step if the receiver can process the mode assignment message and determine the updated AGC setpoint value before the receipt of any additional transmissions.

Figure 6:
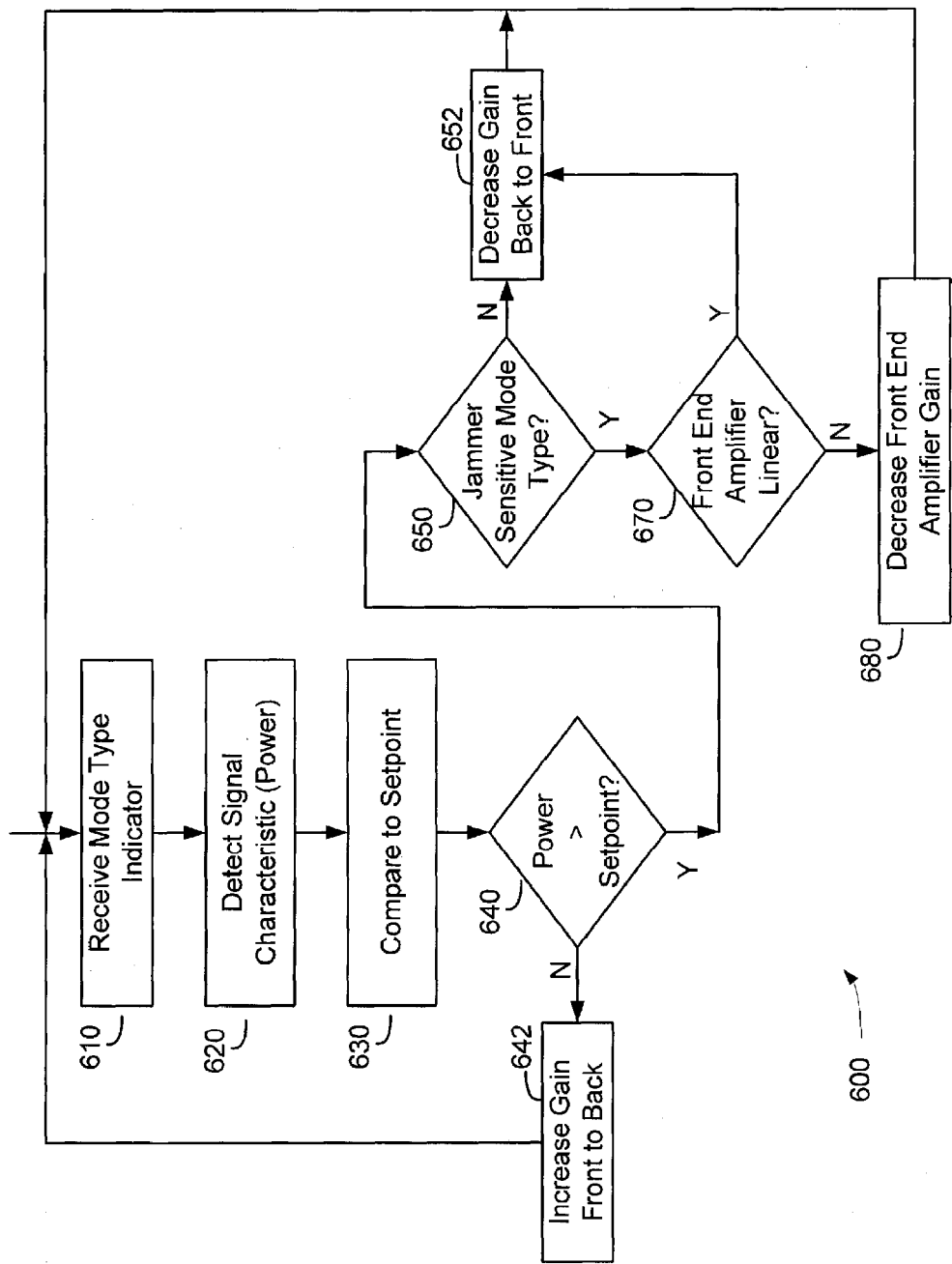
FIG. 6 is a simplified flowchart of an embodiment of a method of varying gain.

FIG. 6 is a simplified flowchart of an embodiment of a method 600 of varying the gain in a receiver based on a mode type. The method 600 can be performed, for example, by the receiver of FIG. 2, when operating in the wireless communication system of FIG. 1. In particular, the method 600 can be performed by the variable AGC setpoint module of FIG. 3.

The method 600 begins at block 610 where the AGC setpoint module receives a mode type indicator. A baseband processor can generate the mode type indicator in response to a mode assignment message. The mode type indicator can indicate, for example, a modulation type, encoding rate, data rate, and the like, or some other characteristic of the received signals.

The variable AGC setpoint module proceeds to block 620 and detects a received signal characteristic such as, for example, a received signal power, a received signal amplitude, a received signal energy, or some other signal characteristic. The signal characteristic is preferably monitored at a location following processing by the variable gain amplifier module.

The variable AGC setpoint module proceeds to block 630 and compares the signal characteristic to the AGC setpoint that is determined based on the mode type of the received signal. The variable AGC setpoint module proceeds to decision block 640.

At decision block 640, the variable AGC setpoint module determines if the characteristic, here the signal power, is greater than the AGC setpoint. If not, the variable AGC setpoint module proceeds to block 642 and increases the gain according to a front to back hierarchy. The variable AGC setpoint module then returns back to block 610.

If at decision block 640, the variable AGC setpoint module determines that the signal power is not greater than the AGC setpoint, the variable AGC setpoint module proceeds to decision block 650. At decision block 650, the variable AGC setpoint module determines if the mode type is one that is subject to interfering signals. For example, the variable AGC setpoint module may store a list of mode types subject to interfering signals. The lower order mode types generally are more likely to experience interfering signals, because those mode types are selected in less ideal environments.

If at decision block 650, the variable AGC setpoint module determines that the current mode type is not subject to interfering signals, the variable AGC setpoint module proceeds to block 652. At block 652, the variable AGC setpoint module decreases the gain in accordance with a back to front hierarchy. The variable AGC setpoint module then proceeds back to block 610.

If at decision block 650, the variable AGC setpoint module determines that the current mode type is subject to interfering signals, the variable AGC setpoint module proceeds to decision block 670 to determine if the front end variable gain amplifier of the variable gain amplifier module is operating in a linear range, or otherwise determine if the front end variable gain amplifier is operating above a predetermined range. If the variable AGC setpoint module determines that the front end variable gain amplifier is operating in a linear region, the variable AGC setpoint module proceeds to block 652 to decrease the gain in accordance with a back to front hierarchy. The variable AGC setpoint module proceeds from block 652 back to block 610.

If at decision block 670, the variable AGC setpoint module determines that the front end variable gain amplifier is not operating in a predetermined range, the variable AGC setpoint module proceeds to block 680 and decreases the gain of the front end variable gain amplifier to put it into the desired operating region. The variable AGC setpoint module then proceeds back to block 610 to repeat the method 600.

Methods and apparatus for varying an AGC setpoint based at least in part on a mode type are described herein. A receiver can be dynamically configured to receive transmissions formatted according to any one of a plurality of mode types. A mode type can characterize a data rate, modulation type, encoding rate, or some other signal parameter. The receiver can determine or select an AGC setpoint based on the assigned mode type.

The receiver can also control the gain based in part on the assigned mode type. For some mode types, a first gain adjustment hierarchy can be implemented. For other mode types, the receiver can implement alternative gain adjustment hierarchies. For example, the receiver can initially maintain a front end variable gain amplifier in a desired operating region before adjusting the gain according to the gain adjustment hierarchy.

As used herein, the term coupled or connected is used to mean an indirect coupling as well as a direct coupling or connection. Where two or more blocks, modules, devices, or apparatus are coupled, there may be one or more intervening blocks between the two coupled blocks.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the scope of the disclosure.

What is claimed is:

1. A method of controlling gain in a receiver, the method comprising:
   receiving a signal having a predetermined modulation type;
   determining the predetermined modulation type of the received signal;
   determining an Automatic Gain Control (AGC) setpoint value based at least in part on the determined modulation type, the AGC setpoint value being a threshold value with respect to which a gain of at least one variable gain amplifier is adjusted;
   comparing the AGC setpoint value with a value of the signal and providing a control signal representing a result of the comparing; and
   applying the control signal to the at least one variable gain amplifier to control a gain of the at least one variable gain amplifier.

2. The method of claim 1, wherein the predetermined modulation type is selected from the group consisting of Quadrature Phase Shift Keying (QPSK), 16Quadrature Amplitude Modulation (QAM), and 64-QAM.

3. The method of claim 1, wherein determining the predetermined modulation type of the received signal comprises:
   receiving an overhead message comprising a modulation type assignment message;
   demodulating the overhead message; and
   extracting the modulation type assignment message.

4. The method of claim 3, further comprising:
   setting the AGC setpoint value from an initial value to a predetermined value prior to receiving the overhead message; and
   resetting the AGC setpoint value to the initial value after receiving the overhead message.

5. The method of claim 3, wherein receiving the overhead message comprises receiving the modulation type assignment message indicative of the modulation type corresponding to a particular frame of information.

6. The method of claim 1, wherein determining the AGC setpoint value comprises selecting the AGC setpoint value from a plurality of setpoint values, each setpoint value in the plurality of setpoint values corresponding to at least one modulation type.

7. The method of claim 1, wherein adjusting the gain of the at least one variable gain amplifier comprises adjusting the gain of at least one of a plurality of variable gain amplifiers based at least in part on a predetermined hierarchy.

8. The method of claim 1, wherein adjusting the gain comprises:
   determining an operating region of a first variable gain amplifier in a series configuration of variable gain amplifiers; and
   adjusting the gain of the first variable gain amplifier to maintain operation within a predetermined operating range based on the determined modulation type.

9. The method of claim 8, further comprising adjusting the gain of at least one of the series configuration of variable gain amplifiers according to a predetermined hierarchy if the operating region of the first variable gain amplifier is within the predetermined operating range.

10. A method of controlling gain in a receiver, the method comprising:
    receiving over a wireless channel a modulation type assignment message indicative of a modulation type for an identified frame of data;
    selecting an Automatic Gain Control (AGC) setpoint value from a plurality of setpoint values based on the received modulation type, each setpoint value in the plurality of setpoint values corresponding to at least one modulation type;
    comparing a characteristic of a signal received during the identified frame of data to the selected AGC setpoint value; and
    adjusting the gain of at least one of a plurality of variable gain amplifiers based on a result of the comparison.

11. The method of claim 10, wherein receiving the modulation type assignment message comprises receiving an Orthogonal Frequency Division Multiplex (OFDM) overhead message.

12. The method of claim 10, wherein the modulation type is a type of modulation applied to subcarriers of an Orthogonal Frequency Division Multiplex (OFDM) symbol.

13. An apparatus with variable gain control, the apparatus comprising:
    a variable gain amplifier module having a signal input, a signal output, and a control input, and configured to amplify a signal by a gain amount determined by a control input signal;
    a processor configured to determine a modulation type of a signal amplified by the variable gain amplifier module;
    a setpoint processor coupled to the processor and the signal output of the variable gain amplifier module, and configured to determine an Automatic Gain Control (AGC) setpoint value based on the determined modulation type, the AGC setpoint value being a threshold value with respect to which a gain of at least one variable gain amplifier is adjusted, and to determine an amount of gain control based on a comparison of a characteristic of a signal at the signal output of the variable gain amplifier module with the determined AGC setpoint value; and
    a gain controller configured to control a level of the control input signal based on the determined amount of gain control.

14. The apparatus of claim 13, further comprising:
    an Analog to Digital Converter (ADC) coupled to the signal output of the variable gain amplifier module and configured to generate a digital representation of the signal at the signal output of the variable gain amplifier module,
    wherein the characteristic of the signal at the signal output of the variable gain amplifier module comprises the digital representation of the signal.

15. The apparatus of claim 13, further comprising:
    a filter coupled to the signal output of the variable gain amplifier module and configured to generate a filtered version of the signal at the signal output of the variable gain amplifier, wherein the characteristic of the signal at the signal output of the variable gain amplifier comprises the filtered version of the signal.

16. The apparatus of claim 13, wherein the variable gain amplifier module comprises a plurality of variable gain amplifiers, the gain amount of each of the plurality of variable gain amplifiers being independently controllable, and wherein the control input signal comprises a plurality of amplifier gain control signals.

17. The apparatus of claim 13, wherein the processor is configured to determine the modulation type by demodulating an overhead message.

18. The apparatus of claim 13, wherein the setpoint processor is configured to determine the AGC setpoint value by retrieving one of a plurality of setpoint values corresponding to the modulation type.

19. The apparatus of claim 13, wherein the setpoint processor is configured to determine the characteristic of the signal at the signal output of the variable gain amplifier by averaging the signal at the signal output of the variable gain amplifier.

20. The apparatus of claim 13, wherein the gain controller is configured to determine a plurality of amplifier gain control signals of the control input signal based on a predetermined hierarchy.

21. The apparatus of claim 13, wherein the gain controller is configured to determine the control input signal based further on the determined modulation type.

22. An apparatus with variable gain control, the apparatus comprising:
- a variable gain amplifier module having an input, an output, and a gain control input, and configured to amplify a received signal by a gain amount determined by a control signal;
- an Analog to Digital Converter (ADC) having an input coupled to the output of the variable gain amplifier module and configured to generate a digital representation of the received signal;
- an AGC setpoint module configured to determine an AGC setpoint value based at least in part on a modulation type of the received signal and to output the AGC setpoint value, the AGC setpoint value being a threshold value with respect to which a gain of at least one variable gain amplifier is adjusted; and
- a comparator having a first input coupled to the ADC and a second input coupled to the AGC setpoint module and configured to compare a characteristic of the digital representation of the received signal to the AGC setpoint value and to provide a control signal coupled to the gain control input of the variable gain amplifier module that represents a result of the comparing.

23. The apparatus of claim 22, further comprising an averager having an input coupled to an output of the ADC and an output coupled to the first input of the comparator.

24. The apparatus of claim 22, further comprising a filter having an input coupled to an output of the ADC and an output coupled to the first input of the comparator.

* * * * *